(12) United States Patent
Tsuchitani et al.

(10) Patent No.: US 6,429,501 B1
(45) Date of Patent: Aug. 6, 2002

(54) SEMICONDUCTOR DEVICE HAVING HIGH BREAKDOWN VOLTAGE AND METHOD FOR MANUFACTURING THE DEVICE

(75) Inventors: Masanobu Tsuchitani, Fuchu; Shingo Satou, Kawasaki, both of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/522,171

(22) Filed: Mar. 9, 2000

(30) Foreign Application Priority Data

Mar. 11, 1999  (JP) .......................................... 11-064591

(51) Int. Cl.[7] .............................................. H01L 23/58
(52) U.S. Cl. ...................... 257/493; 257/492; 257/144; 257/152; 257/487
(58) Field of Search ................................ 257/493, 492, 257/144, 152, 487, 349, 496, 652

(56) References Cited

U.S. PATENT DOCUMENTS

| | | | |
|---|---|---|---|
| 5,086,332 A | * 2/1992 | Nakagawa et al. | ............ 357/51 |
| 5,223,919 A | * 6/1993 | Whight et al. | ............... 257/459 |
| 6,054,748 A | * 4/2000 | Tsukuda et al. | ............. 257/496 |
| 6,069,396 A | * 5/2000 | Funaki | ........................ 257/492 |
| 6,221,760 B1 | * 4/2001 | Hamada | ...................... 438/630 |

FOREIGN PATENT DOCUMENTS

| | | |
|---|---|---|
| JP | 5-63213 | 3/1993 |
| JP | 08306937 | * 11/1996 |

* cited by examiner

*Primary Examiner*—Eddie Lee
*Assistant Examiner*—Eugene Lee
(74) *Attorney, Agent, or Firm*—Finnegan, Henderson, Farabow, Garrett & Dunner, L.L.P.

(57) ABSTRACT

A power device has its main junction formed in a central portion of an N-type substrate. A P-type layer is formed in a peripheral surface portion of the substrate. A P[-]-type RESURF layer of a lower impurity concentration than the P-type layer is formed outside and in contact with the P-type layer. An N[+]-channel stopper layer is formed in an edge surface portion of the substrate. The channel stopper layer is separated from the RESURF layer by a predetermined distance. A recess is formed in that surface portion of the substrate between the P-type layer and the channel stopper layer, which includes a surface portion of the RESURF layer. A semiconductive film is formed in the recess. The RESURF layer has an impurity concentration of about $10^{15}$–$10^{16}$ atoms/cm$^3$ where it contacts the semiconductive film.

14 Claims, 4 Drawing Sheets

SEMICONDUCTOR DEVICE HAVING HIGH BREAKDOWN VOLTAGE AND METHOD FOR MANUFACTURING THE DEVICE

CROSS-REFERENCE TO RELATED APPLICATION

This application is based upon and claims the benefit of priority from the prior Japanese Patent Application No. 11-064591, filed Mar. 11, 1999, the entire contents of which are incorporated herein by reference.

BACKGROUND OF THE INVENTION

This invention relates to a high power semiconductor device and a method for manufacturing the device, and more particularly to an improvement in the structure of a junction end of the device.

High power semiconductor devices such as a diode, a bipolar transistor, a power MOSFET, an IGBT (Insulated Gate Bipolar Transistor), etc. employ the following technique to enhance their breakdown voltages. At a junction end of each device, a semi-insulating polycrystalline silicon film as a passivation film is in direct contact with the substrate of the device. Further, a diffusion layer of a low impurity concentration, i.e. a RESURF (Reduced Surface Field) layer, which has a conductivity opposite to that of the substrate, is formed in that surface portion of the substrate which is located just below the semi-insulating polycrystalline silicon film. This structure can reduce a surface electric field at the junction end. Accordingly, when switching off the power device, a depletion layer caused by a reverse voltage applied thereto uniformly expands. This results in an increase in breakdown voltage and also results in establishment of a stable operation.

The RESURF layer is formed in that surface portion of an N-type substrate, which is located between a P-type layer near a main junction area formed in the substrate, and an N+-channel stopper layer of a high impurity concentration formed in an end surface portion of the device. The RESURF layer is a $P^-$-type layer of a low impurity concentration, and has one end thereof connected to the P-type layer and the other end thereof separated from the $N^+$-channel stopper layer by a predetermined distance. The semi-insulating polycrystalline silicon film is formed on the RESURF layer.

Before forming the semi-insulating polycrystalline silicon film, an oxide film is formed on the entire substrate surface including the surface of the RESURF layer. When forming the semi-insulating polycrystalline silicon film, the oxide film is selectively removed by the photolithography technique, thereby forming an area for providing therein the semi-insulating polycrystalline silicon film. After that, the semi-insulating polycrystalline silicon film is formed on the entire substrate surface including the surface of the RESURF layer.

FIG. 5A shows the concentration distribution of an impurity (boron) in the vicinity of the surface of the RESURF layer, obtained after the formation of the oxide film. FIG. 5B is an enlarged view of a portion indicated by (b) in FIG. 5A, showing the distribution of impurity concentration from the surface of the RESURF layer.

The concentration of the impurity in the RESURF layer surface reduces when, for example, boron diffuses into the oxide film while the oxide film grows. As is understood from FIG. 5B, the concentration especially reduces in a range of from the surface to a depth of 0.05 μm. This is not a desirable impurity concentration in the RESURF layer surface, and it is possible that the impurity concentration will be less than an allowable value.

In such a power semiconductor device, which has a RESURF surface of a low impurity concentration, breakdown voltage drift will easily occur. The breakdown voltage drift is a phenomenon in which a breakdown voltage against a reverse voltage will reduce over time. Accordingly, designed breakdown voltage characteristics will not be able to be obtained over time, which means that the life of the device is short.

BRIEF SUMMARY OF THE INVENTION

The present invention has been developed to solve the above problem, and aims to provide a highly reliable high-power semiconductor device capable of preventing its breakdown voltage from reducing due to breakdown voltage drift, and also to provide a method for manufacturing the device.

This aim is attained by the following device.

The high power semiconductor device of the invention has a RESURF layer at a junction end thereof. The surface of the substrate, which includes the RESURF layer, has a recess, in which a semiconductive film is formed. The depth of the recess reaches that portion of the RESURF layer which has a high impurity concentration. Accordingly, the surface of the RESURF layer does not have a portion of a low impurity concentration. This can prevent reduction of the breakdown voltage of the device, which means that the device can have a long life.

The aim of the invention is also attained by the following method.

In the high power semiconductor device of the invention, a RESURF layer is formed at a junction end thereof. The surface of the substrate, which includes the RESURF layer, is etched to form a recess. A semiconductive film is formed in the recess. The depth of the recess reaches that portion of the RESURF layer which has a high impurity concentration.

Accordingly, the surface of the RESURF layer does not have a portion of a low impurity concentration. This can prevent reduction of the breakdown voltage of the device, which means that the device can have a long life.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
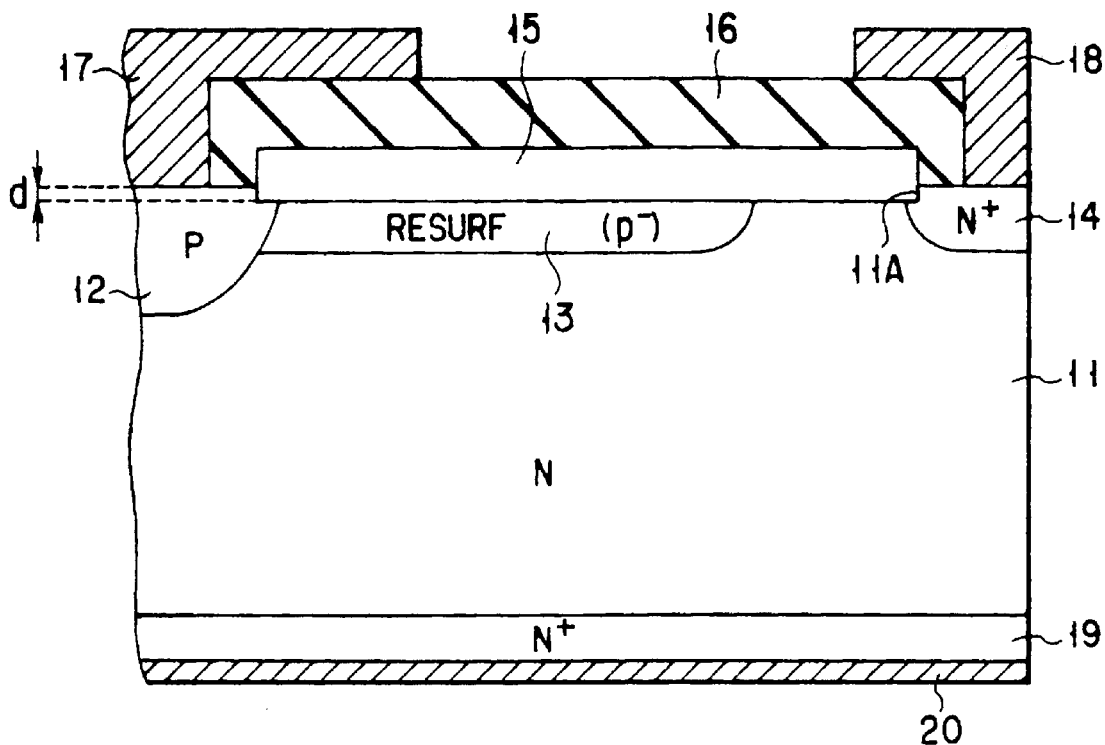
FIG. 1 is a sectional view, showing the structure of a junction end of a high power semiconductor device according to a first embodiment of the invention.

FIG. 1 is a sectional view showing the structure of a junction end of a high power semiconductor device according to a first embodiment of the invention. As shown in FIG. 1, a P-type layer 12 is formed in that surface portion of an N-type substrate 11, which is located near a high power device main junction area. A P$^-$-type RESURF layer 13 of a lower impurity concentration than the P-type layer 12 is formed around it. Further, an N$^+$-channel stopper layer 14 of a high impurity concentration is formed in an edge surface portion of the N-type substrate 11 such that it surrounds the RESURF layer 13. The channel stopper layer 14 is separated from the RESURF layer 13 by a predetermined distance. In the invention, a recess 11A is formed in that surface portion of the substrate 11, which includes the RESURF layer 13 and is located between the P-type layer 12 and the channel stopper layer 14. The recess 11A has a depth of, for example, 0.05–0.2 μm. A semi-insulating polycrystalline silicon film 15 is formed in the recess 11A. The film 15 generally has a higher resistance than a semiconductor, i.e. has a specific resistance of, for example, $10^7$–$10^{13}$ Ωcm. This film is formed of silicon mixed with, for example, at least one of oxygen, nitrogen and carbon. In the case of the semi-insulating polycrystalline silicon film 15 formed in the first embodiment, silicon is mixed with oxygen.

The film 15 is covered with an insulating film 16 formed of, for example, SiO$_2$. The insulating film 16 has openings that expose the P-type layer 12 and the channel stopper layer 14. An electrode 17 to be connected to the P-type layer 12 and an electrode 18 to be connected to the N$^+$-channel stopper layer 14 are formed in the respective openings. The electrodes 17 and 18 are separated by a distance enough to isolate them. On the other hand, an N$^+$-type layer 19 of a high impurity concentration and an electrode 20 connected thereto are formed on the reverse surface of the N-type substrate 11.

Figure 5A:
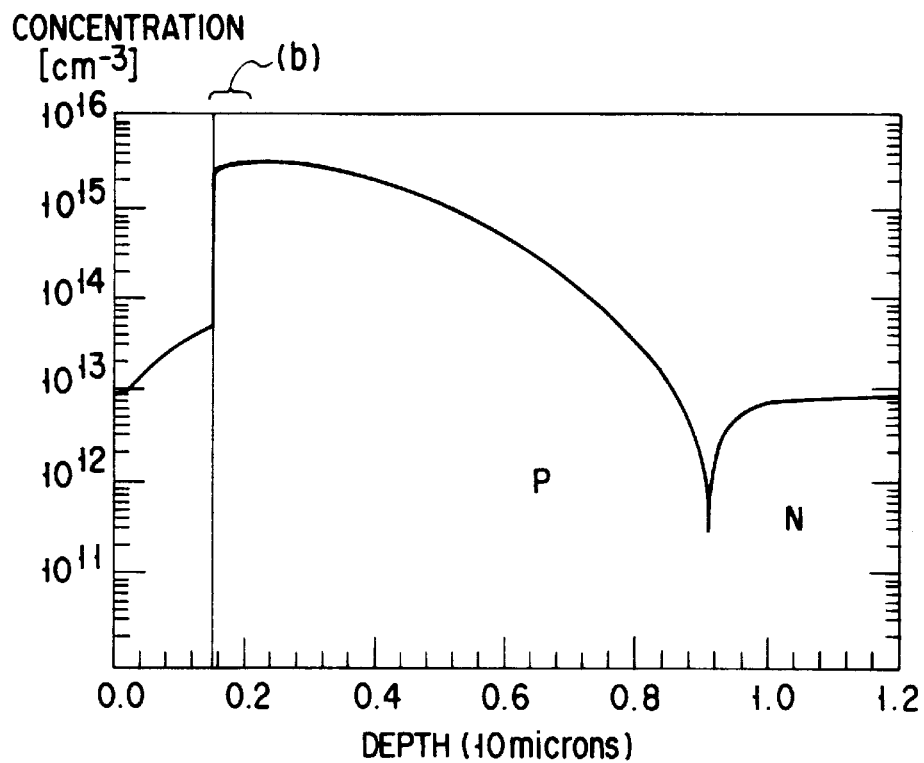
FIG. 5A is a view showing the concentration distribution of an impurity (boron) in the vicinity of a RESURF layer surface, which is obtained after the formation of an oxide film on the layer.
Figure 5B:
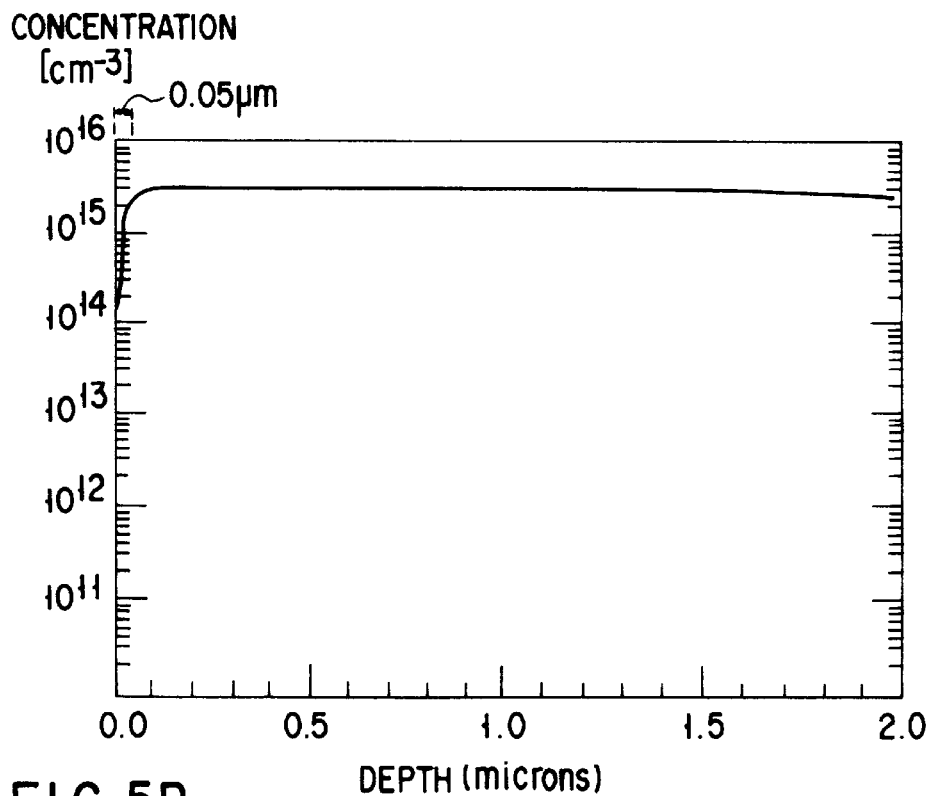
FIG. 5B is a partially enlarged view of FIG. 5A.

As is shown in FIGS. 5A and 5B, the impurity concentration of the RESURF layer 13 from its surface to a depth of about 0.05 μm reduces as the manufacturing process advances immediately after the formation of the RESURF layer 13. In the first embodiment, a low-impurity-concentration area of the RESURF layer 13 is removed to thereby expose the surface of a high-impurity-concentration area.

Specifically, the low-impurity-concentration area of the RESURF layer 13 is removed by, for example, selective wet etching or CDE (Chemical Dry Etching), thereby exposing the surface of an area of an impurity concentration of, for example, $10^{15}$–$10^{16}$ atoms/cm$^3$. After that, the semi-insulating polycrystalline silicon film 15 is deposited. The etching amount d of the surface of the RESURF layer 13 is set at, for example, 0.05–0.2 μm, which is necessary to expose high-impurity-concentration surface portions of the RESURF layer 13.

In the first embodiment, a low-impurity-concentration area that exists in a range of from the surface of the RESURF layer 13 to a depth of about 0.05 μm as shown in FIG. 5B can reliably be removed. Accordingly, the impurity concentration of the exposed surface of the RESURF layer is not less than the allowable value. This prevents breakdown voltage drift, and hence can provide a high power device having a high breakdown voltage characteristic as designed, i.e. can provide a reliable device.

FIGS. 2A–2E show a second embodiment of the invention, and is useful in explaining the order of the process steps of manufacturing, for example, a high power diode. Referring to these figures, a method of forming a junction end of a high power diode will be described in detail.

Figure 2A:
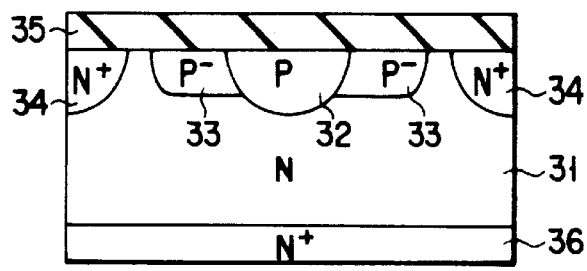
FIGS. 2A–2E are sectional views useful in explaining a method for manufacturing a high power semiconductor device according to a second embodiment of the invention.

As is shown in FIG. 2A, a P-type anode layer 32 and a P$^-$-type RESURF layer 33 are formed in the major surface of an N-type semiconductor substrate 31 having a resistivity ρ of 170 Ωcm and a thickness of 625 μm, such that the layer 33 surrounds the layer 32. An N$^+$-channel stopper layer 34 is formed in an edge surface portion of the major surface of the substrate 31 such that it surrounds the RESURF layer 33. The N$^+$-channel stopper layer 34 is separated from the RESURF layer 33 by a predetermined distance. These layers are formed using an appropriate ion implantation and diffusion technique.

Examples of conditions for ion implantation of the anode layer 32 are as follows. Ion species: B (boron); acceleration voltage: 60 keV; dose: 1×10$^{14}$ ions/cm$^2$; and diffusion conditions: at a temperature of 1150° C., in an atmosphere of nitrogen and for 60 min.

Examples of conditions for ion implantation of the RESURF layer 33 are as follows. Ion species: B (boron); acceleration voltage: 60 keV; dose: 1×10$^{13}$ ions/cm$^2$; and diffusion conditions: at a temperature of 1150° C., in an atmosphere of nitrogen and for 360 min.

Examples of conditions for ion implantation of the channel stopper layer 34 are as follows. Ion species: As (arsenic); acceleration voltage: 40 kev; dose: 5×10$^{15}$ ions/cm$^2$; and diffusion conditions: at a temperature of 1000° C., in an atmosphere of oxygen and for 20 min.

An oxide film 35 is formed on the entire major surface of the substrate 31. Further, an N$^+$-type cathode layer 36 is formed on the reverse surface of the substrate 31, using the ion implantation and diffusion technique. Examples of conditions for ion implantation of the N$^+$-type cathode layer 36 are as follows. Ion species: As (arsenic); acceleration voltage: 40 keV; dose: 5×10$^{15}$ ions/cm$^2$; and diffusion conditions: at a temperature of 1000° C., in an atmosphere of oxygen and for 20 min.

Figure 2B:
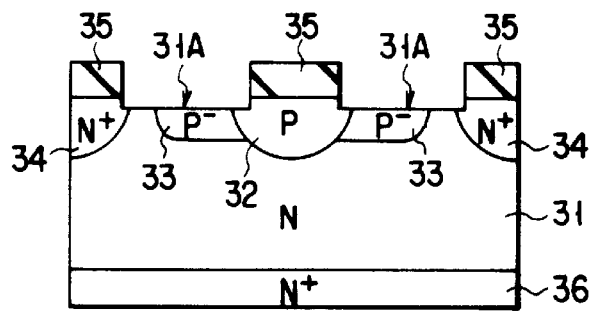

After that, as shown in FIG. 2B, those portions of the oxide film 35, which correspond to the anode layer 32 and the channel stopper layer 34, are removed to expose corresponding surface portions of the substrate 31. Subsequently, the exposed portions of the substrate are subjected to wet etching using, for example, a mixture of fluoric acid and nitric acid. As a result, a recess 31A is formed in that surface portion of the substrate 11, which extends from part of the anode layer 32 to part of the channel stopper layer 34. The recess 31A has a depth of, for example, 0.05–0.2 μm from the surface of the substrate 31. For this process, CDE may be used instead of wet etching. Thus, the low-impurity-concentration area of the RESURF layer 33 is removed, thereby exposing the surface portion of the layer 33, which has an impurity concentration of about $10^{15}$–$10^{16}$ atoms/cm$^3$.

Figure 2C:
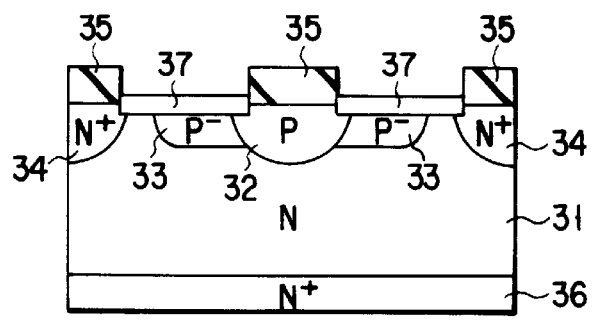

Then, as is shown in FIG. 2C, a semi-insulating polycrystalline silicon film 37 with a thickness of 1.5 μm is formed on the entire surface of the resultant structure at 700.by LPCVD (Low Pressure CVD). After that, the film 37 is left only in the recess 31A, and removed from the other portions of the surface. As a result, the film 37 is provided on the surface of the RESURF layer 33 which has an impurity concentration of about $10^{15}$–$10^{16}$ atoms/cm$^3$.

Figure 2D:
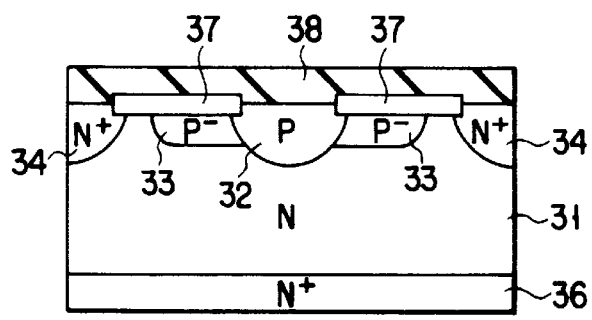

Subsequently, as shown in FIG. 2D, an oxide film 38 is formed on the entire surface of the resultant structure by normal pressure CVD.

Figure 2E:
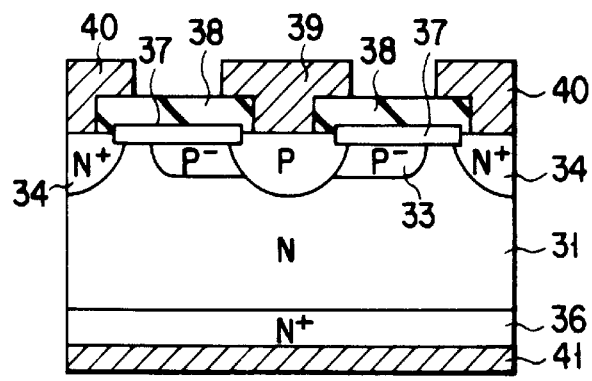

Then, as shown in FIG. 2E, the oxide film 38 is selectively etched, thereby forming openings therein which expose the anode layer 32 and the channel stopper layer 34. Thereafter, an aluminum layer is formed on the entire structure of the resultant structure. The aluminum layer is selectively etched, thereby forming an anode electrode 39 connected to the anode layer 32 and a channel stopper electrode 40 connected to the channel stopper layer 34. Lastly, a cathode electrode 41 made of aluminum is formed on the cathode layer 36 provided on the reverse surface of the substrate.

In the second embodiment, a low-impurity-concentration area that exists in the surface of the RESURF layer 33 is removed, and the semi-insulating polycrystalline silicon film 15 is directly provided on the surface of the RESURF layer 33 which has a high impurity concentration. Accordingly, breakdown voltage drift can be prevented, which means that a breakdown voltage characteristic as designed can be obtained. This being so, a highly reliable high-power diode can be realized.

Moreover, the low-impurity-concentration area is removed by wet etching or CDE, thereby enabling the formation of a surface of a high impurity concentration which is not significantly damaged.

Figure 3:
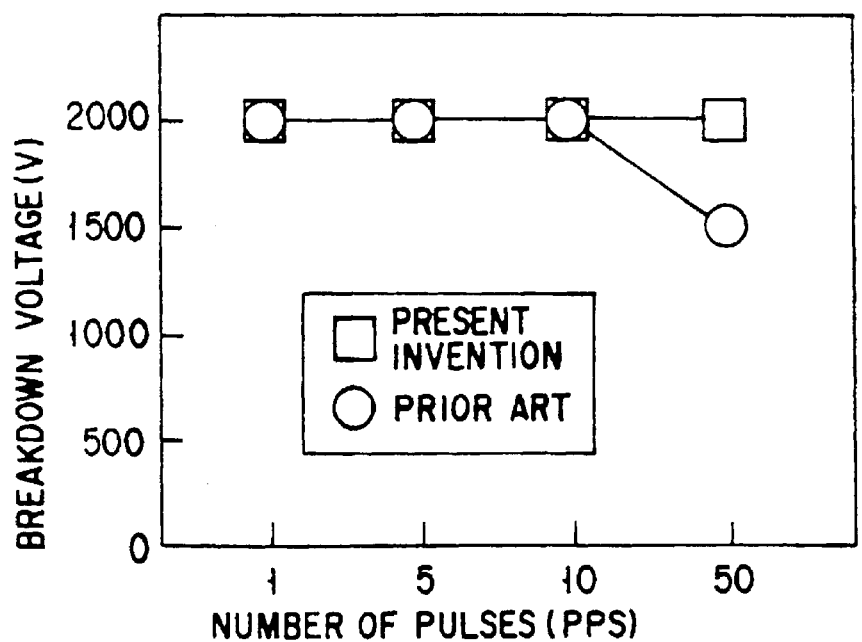
FIG. 3 is a view showing estimation results concerning the breakdown voltage of a high power diode shown in FIGS. 2A–2E and that of a conventional high power diode.

FIG. 3 shows breakdown voltage estimation results of the high power diode of the second embodiment and a conventional high power diode in which the surface of the RESURF layer is not etched. As is understood from the figure, in the case of the conventional device, its breakdown voltage reduces when the number of pulses per second exceeds 10. On the other hand, the breakdown voltage of the device of the present invention does not reduce even if the number of pulses per second exceeds 10.

Figure 4:
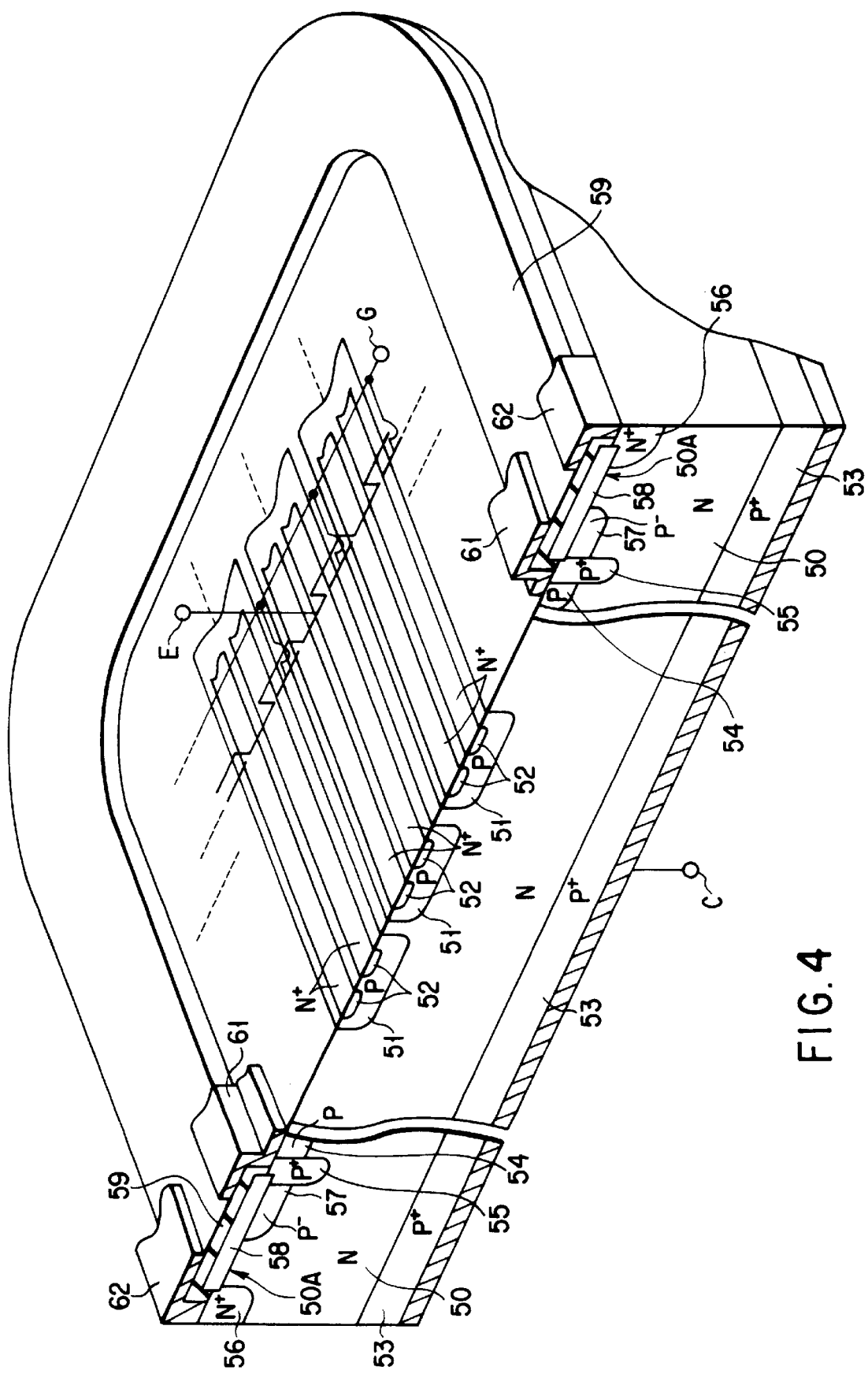
FIG. 4 is a sectional view showing the structure of an IGBT according to a third embodiment of the invention.

FIG. 4 is a sectional view of a third embodiment of the invention, and specifically illustrating a case where the invention is applied to a junction end of, for example, an IGBT. In FIG. 4, a plurality of P-type layers 51 are formed in an element area in an N-type substrate 50. In each P-type layer 51, two stripe-shaped N$^+$-type layers (stripe-shaped emitters) 52 having a higher impurity concentration than the substrate 50 are formed. The N$^+$-type layers 52 are connected to an emitter electrode E. A gate electrode G is provided on the substrate 50 with an insulating film (not shown) interposed therebetween, between each pair of adjacent P-type layers 51 and also between corresponding adjacent N$^+$-type layers 52. Further, a P$^+$-type layer 53 having a high impurity concentration and connected to a collector electrode C is formed on the reverse surface of the substrate 50.

A P-type layer 54 having the same potential as the emitter electrode E is formed on the substrate 50 around the element area. A P$^+$-type guard ring layer 55 of a high impurity concentration is formed in a surface portion of the substrate 50 outside and in contact with the P-type layer 54. A P$^-$-type RESURF layer 57 of a low impurity concentration is formed in a surface portion of the substrate 50 outside and in contact with the guard ring layer 55. An N$^+$-channel stopper layer 56 of a high impurity concentration is formed in an edge surface portion (in the surface of a terminating end portion) of the substrate 50 such that it separates from the RESURF layer 57 by a predetermined distance.

A recess 50A is formed in a surface portion of the substrate 50 between the guard ring layer 55 and the channel stopper layer 56 by wet etching or CDE. The recess 50A exposes part of the guard ring layer 55, part of the channel stopper layer 56, a surface portion of the RESURF layer 57, and a surface portion of the substrate 50 between the RESURF layer 57 and the channel stopper layer 56. As aforementioned, the recess 50A has a depth necessary to remove the low-impurity-concentration area of the RESURF layer 37. Accordingly, the surface of the RESURF layer 57 which is exposed by the recess 50A has an impurity concentration of about $10^{15}$–$10^{16}$ atoms/cm$^3$. A semi-insulating polycrystalline silicon film 58 is formed in the recess 50A. The film 58 is covered with an insulating film 59. An electrode 61 is connected to the P-type layer 54 and the guard ring layer 55, and also to the emitter electrode E. An electrode 62 is connected to the channel stopper layer 56. The electrodes 61 and 62 are sufficiently separated from each other so that they will be electrically isolated from each other.

In the third embodiment described above, the low-impurity-concentration surface area of the RESURF layer 57 is removed at the junction end of the IGBT, and the semi-insulating polycrystalline silicon film 58 is directly provided on the surface of the RESURF layer 57 which has a high impurity concentration. Accordingly, breakdown voltage drift can be prevented, which means that a breakdown voltage characteristic as designed can be obtained. This being so, a highly reliable highpower diode can be realized.

In addition, the low impurity concentration area is removed by wet etching or CDE. This enables the formation of a surface of a high impurity concentration which is not significantly damaged.

Although a description has been given of a high power diode in the second embodiment, and given of an IGBT in the third embodiment, the invention is not limited to them, but also applicable to the junction end structure of another type of power device such as a high power bipolar transistor, a power MOSFET, etc.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a semiconductor substrate of a first conductivity type;
   a first diffusion layer of a second conductivity type formed in a central surface portion of the substrate, the first diffusion layer serving as an anode;
   a second diffusion layer of the second conductivity type, which is formed in a surface portion of the substrate, has a lower impurity concentration than the first diffusion layer, and is located outside and in contact with the first diffusion layer;
   a third diffusion layer of the first conductivity type, which is formed in a surface portion of the substrate, is located outside the first diffusion layer, and is separated from the first diffusion layer by a predetermined distance;
   a recess formed in that surface portion of the substrate between the first and third diffusion layers, which includes a surface portion of the second diffusion layer;

a semiconductive film formed in the recess; and a fourth diffusion layer formed in a reverse surface of the substrate and having a higher impurity concentration than the substrate, the fourth diffusion layer serving as a cathode.

2. A semiconductor device according to claim 1, wherein the second diffusion layer has an impurity concentration of about $10^{15}$–$10^{16}$ atoms/cm$^3$ at a bottom of the recess.

3. A semiconductor device according to claim 1, wherein the recess has a depth of about 0.05–0.2 $\mu$m from a top level of the substrate.

4. A semiconductor device according to claim 1, wherein the semiconductive film is formed of silicon at least mixed with one of oxygen, nitrogen and carbon.

5. A semiconductor device according to claim 1, wherein the semiconductive film has a special resistance of $10^7$–$10^{13}$ $\Omega$cm.

6. A semiconductor device comprising:

a semiconductor substrate of a first conductivity type;

a plurality of first diffusion layers of a second conductivity type formed in central surface portions of the substrate;

second and third diffusion layers of the first conductivity type, which are formed in surface portions of the substrate in each of the first diffusion layers, the second and third diffusion layers serving as emitter regions;

a gate electrode provided above the substrate such that it corresponds to those of the second and third diffusion layers, which are adjacent to each other and included in each pair of adjacent ones of the first diffusion layers;

a semiconductor layer of the second conductivity type formed as a collector electrode on a reverse surface of the substrate;

a fourth diffusion layer of the second conductivity type formed in a peripheral surface portion of the substrate;

a fifth diffusion layer of the second conductivity type, which has a lower impurity concentration than the fourth diffusion layer and is formed in a surface portion of the substrate outside and in contact with the fourth diffusion layer;

a sixth diffusion layer of the first conductivity type, which is formed in a surface portion of the substrate outside the fifth diffusion layer, and is separated from the fifth diffusion layer by a predetermined distance;

a recess formed in that surface portion of the substrate between the fourth and sixth diffusion layers, which includes a surface portion of the fifth diffusion layer; and a semiconductive film formed in the recess.

7. A semiconductor device according to claim 6, wherein the sixth diffusion layer has an impurity concentration of about $10^{15}$–$10^{16}$ atoms/cm$^3$ at a bottom of the recess.

8. A semiconductor device according to claim 6, wherein the recess has a depth of about 0.05–0.2 $\mu$m from a top level of the substrate.

9. A semiconductor device according to claim 6, wherein the semiconductive film is formed of silicon at least mixed with one of oxygen, nitrogen and carbon.

10. A semiconductor device according to claim 6, wherein the semiconductive film has a special resistance of $10^7$–$10^{13}$ $\Omega$cm.

11. The semiconductor device according to claim 1, wherein the surface portion of the second diffusion layer is an entire upper surface of the second diffusion layer, and the entire upper surface thereof is located at a bottom portion of the recess.

12. The semiconductor device according to claim 1, wherein the surface portion of the second diffusion layer is an entire upper surface of the second diffusion layer, and the entire upper surface thereof is in contact with the semiconductive film in the recess.

13. The semiconductor device according to claim 6, wherein the surface portion of the fifth diffusion layer is an entire upper surface of the fifth diffusion layer, and the entire upper surface thereof is located at a bottom portion of the recess.

14. The semiconductor device according to claim 6, wherein the surface portion of the fifth diffusion layer is an entire upper surface of the fifth diffusion layer, and the entire upper surface thereof is in contact with the semiconductive film in the recess.

* * * * *